(12) United States Patent
Sakai et al.

(10) Patent No.: US 7,649,252 B2
(45) Date of Patent: Jan. 19, 2010

(54) CERAMIC MULTILAYER SUBSTRATE

(75) Inventors: Norio Sakai, Moriyama (JP); Jun Harada, Yasu (JP); Satoshi Ishino, Kusatsu (JP); Yoshihiko Nishizawa, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 222 days.

(21) Appl. No.: 10/549,986

(22) PCT Filed: Oct. 15, 2004

(86) PCT No.: PCT/JP2004/015213

§ 371 (c)(1),
(2), (4) Date: Sep. 19, 2005

(87) PCT Pub. No.: WO2005/067359

PCT Pub. Date: Jul. 21, 2005

(65) Prior Publication Data

US 2006/0081977 A1 Apr. 20, 2006

(30) Foreign Application Priority Data

Dec. 26, 2003 (JP) .............................. 2003-434347

(51) Int. Cl.
*H01L 23/12* (2006.01)
*H01L 23/06* (2006.01)
(52) U.S. Cl. ...................... 257/700; 257/703
(58) Field of Classification Search ................ 257/687, 257/690, 691, 700, 703, 705, 728, 729, E23.009, 257/E29.038, E23.106, E23.113
See application file for complete search history.

(56) References Cited

U.S. PATENT DOCUMENTS

| | | | |
|---|---|---|---|
| 4,754,371 | A | 6/1988 | Nitta et al. |
| 5,110,664 | A | 5/1992 | Nakanishi et al. |
| 5,177,670 | A | 1/1993 | Shinohara et al. |
| 5,331,204 | A | 7/1994 | Kuroda et al. |

(Continued)

FOREIGN PATENT DOCUMENTS

JP          61-30099          2/1986

(Continued)

OTHER PUBLICATIONS

Official communication issued in the counterpart European Application No. 04792430.3, mailed on Jul. 16, 2007.

(Continued)

*Primary Examiner*—Hung Vu
(74) *Attorney, Agent, or Firm*—Keating & Bennett, LLP

(57) ABSTRACT

A ceramic multilayer substrate has a ceramic laminate including a plurality of ceramic layers laminated, having a first main surface, and including internal circuit elements disposed in the inside, a resin layer having a bonding surface in contact with the first main surface of the ceramic laminate and a mounting surface opposite to the bonding surface, external electrodes, each disposed on the mounting surface of the resin layer and electrically connected to at least one of the internal circuit elements of the ceramic laminate, and a ground electrode, a dummy electrode, or capacitor electrodes disposed at an interface between the first main surface of the ceramic laminate and the bonding surface of the resin layer or in the inside of the resin layer.

8 Claims, 3 Drawing Sheets

U.S. PATENT DOCUMENTS

| | | |
|---|---|---|
| 6,353,189 B1 | 3/2002 | Shimada et al. |
| 6,775,150 B1 | 8/2004 | Chakravorty et al. |
| 7,120,031 B2 | 10/2006 | Chakravorty et al. |
| 2002/0140081 A1 | 10/2002 | Chou et al. |
| 2003/0071350 A1 | 4/2003 | Takehara et al. |
| 2004/0066617 A1* | 4/2004 | Hirabayashi et al. ........ 361/683 |
| 2004/0238942 A1 | 12/2004 | Chakravorty et al. |
| 2006/0279940 A1 | 12/2006 | Chakravorty et al. |

FOREIGN PATENT DOCUMENTS

| | | |
|---|---|---|
| JP | 07-142867 | 6/1995 |
| JP | 10-242335 | 9/1998 |
| JP | 2000-004071 | 1/2000 |
| JP | 2001-7250 A | 1/2001 |
| JP | 2002-76629 A | 3/2002 |
| JP | 2002-094247 | 3/2002 |
| JP | 2002-094410 | 3/2002 |
| JP | 2002-185222 | 6/2002 |
| JP | 2002-198655 | 7/2002 |
| JP | 2003-23257 | 1/2003 |
| JP | 2003-086990 | 3/2003 |
| JP | 2003-124435 | 4/2003 |
| JP | 2003-188538 A | 7/2003 |
| JP | 2003-347467 | 12/2003 |
| WO | WO98/47331 | 10/1998 |
| WO | 02/19430 A | 3/2002 |

OTHER PUBLICATIONS

Offical Communication issued in corresponding Korean Patent Application No. 10-2005-7019001, dated Nov. 22, 2006.

Official communication issued in counterpart Chinese Application No. 2004800082006, mailed on Jun. 20, 2008.

Official communication issued in counterpart Chinese Application No. 2004800082006, mailed Dec. 19, 2008.

* cited by examiner

CERAMIC MULTILAYER SUBSTRATE

BACKGROUND OF THE INVENTION

1. Field of the Invention

The present invention relates to a ceramic multilayer substrate.

2. Description of the Related Art

Various high-frequency modules, e.g., chip antennas, delay lines, high-frequency combination switch modules, and receiving devices, are mounted in the inside of information communications apparatuses, e.g., portable terminals. Such a high-frequency module is mounted on a wiring substrate.

In general, circuit components are mounted on a multilayer substrate in such a high-frequency module. Multilayer substrates including ceramic multilayer substrates are well-known. Most of ceramic multilayer substrates are provided with ground electrodes in order to eliminate noise. This is disclosed in Japanese Unexamined Patent Application Publication No. 2002-94410 (Patent Document 1), for example.

In general, ground electrodes are provided in the inside of ceramic multilayer substrates at locations as close to the bottom surfaces as possible. This is because unnecessary impedance components, e.g., stray capacitances and stray inductances, are eliminated by arranging the ground electrodes as close to ground electrodes of wiring substrates as possible.

FIG. 8 shows an example of a known ceramic multilayer substrate. In a ceramic multilayer substrate 100, electronic components 13a, 13b, and 13c are mounted on a ceramic laminate 10 including laminated ceramic layers 11. A ground electrode 12 is provided in the vicinity of a bottom surface of the ceramic multilayer substrate 100 and is sandwiched between ceramic layers 11m and 11n.

The ground electrode requires a wide area and, therefore, a conductor pattern having a wide area must be provided on a ceramic green sheet during production of a ceramic multilayer substrate. However, as the area of the conductor pattern is increased, the mutual contact area of the two ceramic green sheets sandwiching the conductor pattern therebetween decreases. As a result, the bondability between the ceramic green sheets is reduced.

In the ceramic multilayer substrate 100, shown in FIG. 8, the bondability between the ceramic green sheets 11m and 11n is reduced due to an increase in the area of the ground electrode 12 sandwiched by the ceramic green sheets 11m and 11n.

Furthermore, the ceramic layers are loaded due to the difference in the amount of shrinkage between the conductor pattern and the ceramic green sheets during baking. The effect of this load increases as the area of the conductor pattern increases. Consequently, delamination and cracks in the ceramic layers often occur, particularly in the vicinity of the ground electrode of the ceramic multilayer substrate after baking.

In order to overcome this problem, the ground electrode has been provided so as to be exposed on the bottom surface of the ceramic multilayer substrate. However, in that case, another problem occurs in that a short circuit often occurs between the ground electrode and wirings on the wiring substrate.

SUMMARY OF THE INVENTION

To overcome the problems described above, preferred embodiments of the present invention provide a ceramic multilayer substrate having a ground electrode is disposed at a location in extremely close proximity to a wiring substrate without causing a short circuit between the ground electrode and the wiring substrate even when the ceramic multilayer substrate is mounted on the surface of the wiring substrate and, in addition, problems, e.g., cracks, do not occur during the baking.

A ceramic multilayer substrate according to a first preferred embodiment of the present invention includes a ceramic laminate including a plurality of laminated ceramic layers, having a first main surface, and including internal circuit elements disposed in the inside thereof, a resin layer having a bonding surface in contact with the first main surface of the ceramic laminate and a mounting surface opposite to the bonding surface, external electrodes, each disposed on the mounting surface of the resin layer and electrically connected to at least one of the internal circuit elements of the ceramic laminate, and a ground electrode, a dummy electrode, or capacitor electrodes disposed at an interface between the first main surface of the ceramic laminate and the bonding surface of the resin layer or in the inside of the resin layer. With this configuration, the ground electrode, the dummy electrode, or the capacitor electrodes are disposed at a location in extremely close proximity to the mounting surface. As a result, the distance between the ground electrode, the dummy electrode, or the capacitor electrodes and the wiring substrate is greatly decreased.

Preferably, the ground electrode, the dummy electrode, or the capacitor electrodes are preferably made of a sintered metal integrally baked with the ceramic laminate. With this configuration, the surface roughness of the electrode itself is increased as compared to that of an electrode that is formed by attaching metal foil, and the bonding strength is increased due to an anchor effect of bonding to the resin layer.

A ceramic multilayer substrate according to a second preferred embodiment of the present invention includes a ceramic laminate including a plurality of laminated ceramic layers, having a first main surface, and including internal circuit elements disposed in the inside thereof, a resin layer having a bonding surface in contact with the first main surface of the ceramic laminate and a mounting surface opposite to the bonding surface, external electrodes, each disposed on the mounting surface of the resin layer and electrically connected to at least one of the internal circuit elements of the ceramic laminate, a ground electrode disposed at an interface between the first main surface of the ceramic laminate and the bonding surface of the resin layer or in the inside of the resin layer, and capacitor electrodes facing the ground electrode from the side opposite to the mounting surface such that capacitors are defined by the ground electrode and the capacitor electrodes. With this configuration, capacitors having very stable characteristics are provided.

Preferably, first circuit components mounted on the first main surface and covered with the resin layer are provided, wherein the ground electrode, the dummy electrode, or the capacitor electrodes are disposed on the side closer to the mounting surface than the first circuit components. With this configuration, the electronic components are mounted not only on the top surface of the ceramic laminate, but also on the bottom surface. Consequently, an increase in the density of electronic components and space saving of wiring substrates are achieved.

Preferably, the first circuit components are disposed within the region defined by projecting the ground electrode, the dummy electrode, or the capacitor electrodes on the first main surface. With this configuration, the ground electrode provides a shielding effect on the first circuit components.

Preferably, the electrical connections from the external electrodes to the internal circuit elements are provided by relay electrodes arranged so as to extend along the first main surface. With this configuration, the location of an upper via and the location of a lower via can be shifted with respect to each other. Therefore, the flexibility in the design is increased.

Preferably, the ceramic laminate has a second main surface on the opposite side to the first main surface, and second circuit components are mounted on the second main surface. With this configuration, an increase in the density of electronic components and space saving of wiring substrates is achieved.

Preferably, a conductor case is disposed on the second main surface to cover the second circuit components. With this configuration, since the second circuit components are covered with the conductor case, the second circuit components are shielded against external electromagnetic waves, and leakage of electromagnetic waves generated by the second circuit components to the outside is also prevented.

Preferably, the second circuit components on the second main surface are covered with a molded resin layer. With this configuration, the second circuit components are protected from, for example, collision with other components.

According to preferred embodiments of the present invention, the ground electrode is arranged at a position in extremely close proximity to the mounting surface. As a result, the distance between the ground electrode and the wiring substrate is decreased. Since the necessity for a ceramic layer under the ground electrode is avoided, it is possible to prevent the problem that delamination or cracks occur in the ceramic layers under the ground electrode during baking. Furthermore, since the ground electrode is covered with the resin layer, short circuiting between the ground electrode and the electrode of the wiring substrate is prevented even when this ceramic multilayer substrate is mounted on the surface of the wiring substrate.

Other features, elements, steps, advantages and characteristics of the present invention will become more apparent from the following detailed description of preferred embodiments thereof with reference to the attached drawings.

DETAILED DESCRIPTION OF PREFERRED EMBODIMENTS

Herein, the terms "upper" and "lower" do not refer to the absolute top or bottom, but rather, refer to upper and lower portions relative to locations shown in the reference drawing.

First Preferred Embodiment

Figure 1:
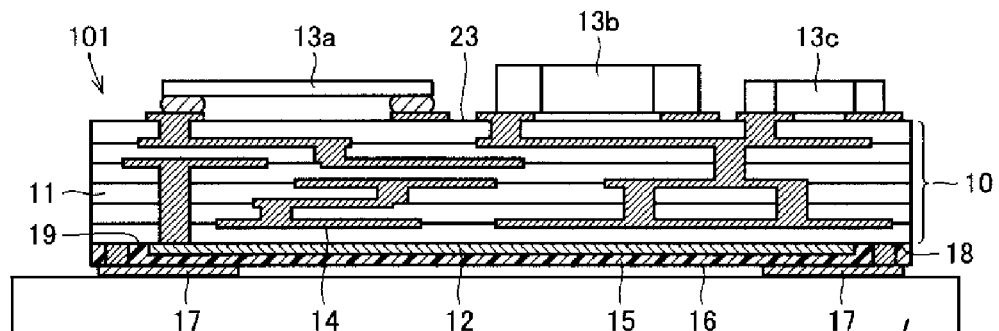
FIG. 1 is a sectional view of a ceramic multilayer substrate according to a first preferred embodiment of the present invention.

A ceramic multilayer substrate 101 according to a first preferred embodiment of the present invention will be described with reference to FIG. 1. This ceramic multilayer substrate 101 is provided with a ceramic laminate 10 including a plurality of laminated ceramic layers 11. Internal circuit elements 14 are disposed in the inside of the ceramic laminate 10. The internal circuit elements 14 include via hole conductors extending in ceramic layers 11 in a direction of lamination and in-plane conductors disposed at interfaces between the ceramic layers 11. The ceramic laminate 10 includes a bottom surface defining a first main surface 18. A ground electrode 12 is arranged so as to cover the first main surface 18 of the ceramic laminate 10. Furthermore, a resin layer 15 is arranged so as to cover the ground electrode 12.

The resin layer 15 includes a bonding surface 19 in contact with the first main surface 18 and a mounting surface 16 opposite to the bonding surface 19. External electrodes 17 are disposed on the mounting surface 16. That is, in the present preferred embodiment, the ground electrode 12 is disposed at the interface between the first main surface 18 of the ceramic laminate 10 and the bonding surface 19 of the resin layer 15.

The external electrode 17 is electrically connected to at least one of the internal circuit elements 14 through a via hole disposed in the resin layer 15. Some external electrodes 17 do not appear to be connected to any internal circuit element 14 in the FIG. 1. However, these are connected to respective internal circuit elements 14 at locations not shown in this sectional view. The ceramic laminate 10 includes a top surface defining a second main surface 23 opposite to the first main surface 18. Electronic components 13a, 13b, and 13c are mounted on the second main surface 23.

The ceramic layer 11 can be formed from a ceramic material that is capable of being sintered at a low temperature. The ceramic material capable of being sintered at a low temperature refers to a ceramic material which can be baked at a temperature of about 1,000° C. or less. Examples thereof include glass composite materials produced by mixing a ceramic powder, e.g., alumina, forsterite, or cordierite, with borosilicate glass, crystallized glass materials including $ZnO$—$MgO$—$Al_2O_3$—$SiO_2$ base crystallized glass, and non-glass materials including, e.g., $BaO$—$Al_2O_3$—$SiO_2$ base ceramic powders and $Al_2O_3$—$CaO$—$SiO_2$—$MgO$—$B_2O_3$ base ceramic powders. The ceramic layers 11 include ceramic material that is capable of being sintered at a low temperature and, thereby, low resistance and low melting point metallic materials, e.g., Ag or Cu, can be used as a metallic material defining the internal circuit elements 14 in the ceramic laminate 10. Consequently, the ceramic laminate 10 and the internal circuit elements 14 disposed therein can be produced by simultaneous baking at about 1,000° C. or less.

Preferably, the ground electrode 12 disposed between the first main surface 18 of the ceramic laminate 10 and the bonding surface 19 of the resin layer 15 has an area that is in the range of about 3% to about 98% of the area of the first main surface 18, and more preferably in the range of about 40% to about 95%. This is because the bonding strength of the resin layer described below is greatly increased. The thickness of the resin layer 15 is about 5 μm to about 500 μm, and preferably is about 10 μm to about 300 μm. The thickness may be less than the thickness of the ceramic laminate 10. This is because the connection distance from the ground electrode of the mother substrate is decreased and, thereby, the parasitic inductance is decreased, such that excellent high-frequency characteristics are provided, particularly in applications at high frequencies.

The ground electrode 12 may be an electrode made of metal foil, e.g., copper foil. However, preferably the ground electrode 12 is made of a sintered metal. In general, the surface of the ceramic laminate 10 has a surface roughness Rmax at the same level as that of common copper foil. That is, the Rmax is a few micrometers and, therefore, the bonding strength to the resin layer 15 is relatively low. Since the surface roughness Rmax of the sintered metal is several tens of micrometers, and is an order of magnitude greater than the surface roughness Rmax of the copper foil, when the ground electrode 12 made of the sintered metal is interposed between the ceramic laminate 10 and the resin layer 15, the bonding strength between the ground electrode 12 and the resin layer 15 is increased by the anchor effect of the sintered metal. The above-described difference in the surface roughness results from the copper foil being formed by plating or rolling of a copper plate, whereas the sintered metal is formed by baking a conductive paste containing about 10 to about 40 percent by volume of resin, referred to as varnish, the resin component is burnt off to leave voids in the inside or on the surface and, thereby, the surface roughness is increased.

The ground electrode 12 is an electrode at a ground potential. Other electrodes may be disposed in place of the ground electrode 12. In that case, it is essential only that the electrode taking the place of the ground electrode 12 is an electrode having a large area as described above. For example, the electrode may be a dummy electrode that is electrically independent of the internal circuit elements 14, or a capacitor electrode which defines a capacitor in combination with any other electrode.

The ceramic multilayer substrate 101 in the present preferred embodiment is preferably produced as described below.

A conductive paste is patterned on a ceramic green sheet and, thereby, a predetermined conductor pattern to define internal circuit elements 14 is formed on the ceramic green sheet. Likewise, a plurality of ceramic green sheets having predetermined conductor patterns are produced. The plurality of ceramic green sheets are laminated while sandwiching the conductor patterns therebetween. A conductor pattern to define the ground electrode 12 is formed on the back of the unbaked laminate to become the ceramic laminate 10. Alternatively, a conductor pattern to define the ground electrode 12 is formed on a ceramic green sheet, the resulting ceramic green sheet is laminated and, thereby, an unbaked laminate having the conductor pattern to define the ground electrode 12 is produced.

The resulting structure is then baked. As a result, the unbaked laminate is converted to the ceramic laminate 10 which is made of a sintered ceramic, and the conductor pattern to define the ground electrode is converted to the ground electrode 12 made of a sintered metal.

Furthermore, a resin sheet in a semi-hardened state, that is, in a state of B stage, is laminated so as to cover the ground electrode 12, followed by curing, such that the resin layer 15 is produced. Through holes are formed in the resin layer 15 with a laser or other suitable device, and are filled in with an electrically conductive material, e.g., an electrically conductive resin or solder. Alternatively, a resin sheet having through holes filled in with an electrically conductive material in advance may be laminated. Subsequently, electrodes are formed from metal foil or other suitable material on the surface of the resin layer 15, such that the external electrodes 17 are produced. With respect to the external electrodes 17, end surfaces of the conductive materials disposed in the resin layer may be used as external electrodes. On the other hand, surface-mount electronic components 13*a*, 13*b*, and 13*c*, e.g., semiconductor devices and chip type monolithic capacitors, are mounted on the top surface of the ceramic laminate 10. In this manner, the ceramic multilayer substrate 101 shown in FIG. 1 is produced.

In the present preferred embodiment, the ground electrode 12 can be arranged at a location in extremely close proximity to the mounting surface 16. The ground electrode 12 is thus arranged extremely close to a wiring substrate, e.g., a mother board M, during mounting. In the present preferred embodiment, since no ceramic layer is disposed under the ground electrode 12, the problems of delamination and cracks occurring in ceramic layers under the ground electrode during baking are prevented. Furthermore, since the ground electrode 12 is covered with the resin layer 15, short circuiting between the ground electrode 12 and the electrode of the wiring substrate is prevented even when the ceramic multilayer substrate 101 is mounted on the surface of the wiring substrate, e.g., the mother board M.

Preferably, the ground electrode 12 is made of a sintered metal that is integrally baked with the ceramic laminate 10. This is because when the electrode is integrally baked, the bonding strength between the ceramic laminate 10 and the ground electrode 12 is increased and, in addition, since the surface roughness of the electrode itself is increased as compared to that in the case in which the electrode is formed by attaching metal foil, e.g., copper foil, the bonding strength is increased due to an anchor effect with respect to bonding to the resin layer 15, as described above.

Second Preferred Embodiment

A ceramic multilayer substrate 102 according to a second preferred embodiment of the present invention will be described with reference to FIG. 2. In this ceramic multilayer substrate 102, the ground electrode 12 is disposed in the inside of the resin layer 15, and is sandwiched by the resin layer 15 from above and below, so as to prevent contact with the first main surface 18. The configurations of the other portions are similar to those described in the first preferred embodiment.

In the present preferred embodiment, there is no portion in which the ground electrode 12 and the ceramic layer 11 are in direct contact with each other, and therefore, problems, e.g., cracks resulting from the difference in heat shrinkage between the ground electrode 12 and the ceramic layer 11 are reliably prevented.

Figure 2:
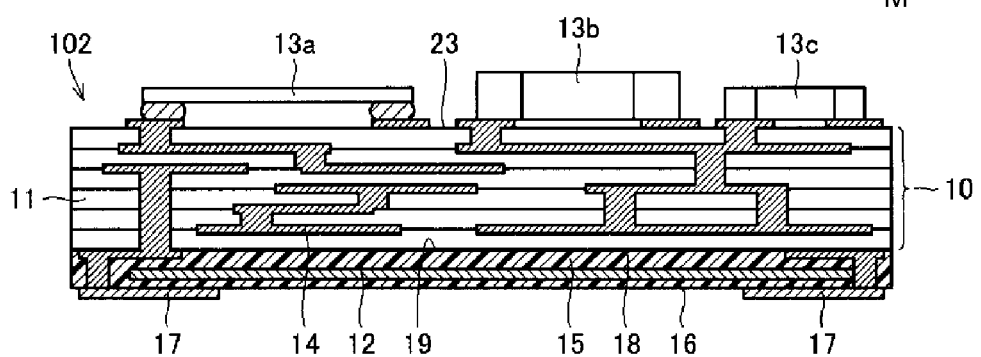
FIG. 2 is a sectional view of a ceramic multilayer substrate according to a second preferred embodiment of the present invention.

The structure shown in FIG. 2 may be constructed by laminating a plurality of resin sheets to form the resin layer 15, and inserting copper foil between the sheets. The copper foil interposed in the inside of the resin layer 15 defines the ground electrode 12.

Third Preferred Embodiment

A ceramic multilayer substrate 103 according to a third preferred embodiment of the present invention will be described with reference to FIG. 3. In this ceramic multilayer substrate 103, the capacitor electrodes 20 are provided in addition to the ground electrode 12 on the surface of an internal layer of the resin layer 15. The capacitor electrodes 20 are electrodes which face the ground electrode 12 from the side opposite to the mounting surface 16 and, thereby, define capacitors in combination with the ground electrode 12. These capacitors are electrically connected to the internal circuit elements 14 to define predetermined circuits. The configurations of the other portions are similar to those described in the second preferred embodiment. The capacitor electrodes 20 may be provided at the interface between the ceramic laminate 10 and the resin layer 15.

In this ceramic multilayer substrate 103, the capacitors are defined by the capacitor electrodes 20 and the ground electrode 12. In this manner, capacitors having very stable characteristics are produced.

Fourth Preferred Embodiment

A ceramic multilayer substrate 104 according to a fourth preferred embodiment of the present invention will be described with reference to FIG. 4. In this ceramic multilayer substrate 104, surface-mount electronic components 22a, 22b, and 22c, such as semiconductor devices and chip type monolithic capacitors, are surface-mounted as first circuit components on the first main surface 18 which is the bottom surface of the ceramic laminate 10. The resin layer 15 is arranged to cover the electronic components 22a, 22b, and 22c. The ground electrode 12 is disposed closer to the mounting surface 16 than the electronic components 22a, 22b, and 22c, that is, below the electronic components. The configurations of the other portions are similar to those described in the second preferred embodiment.

In the present preferred embodiment, the electronic components are mounted not only on the top surface of the ceramic laminate 10, but also on the bottom surface. Consequently, an increase in the density of electronic components and space saving of wiring substrates are achieved.

Figure 4:
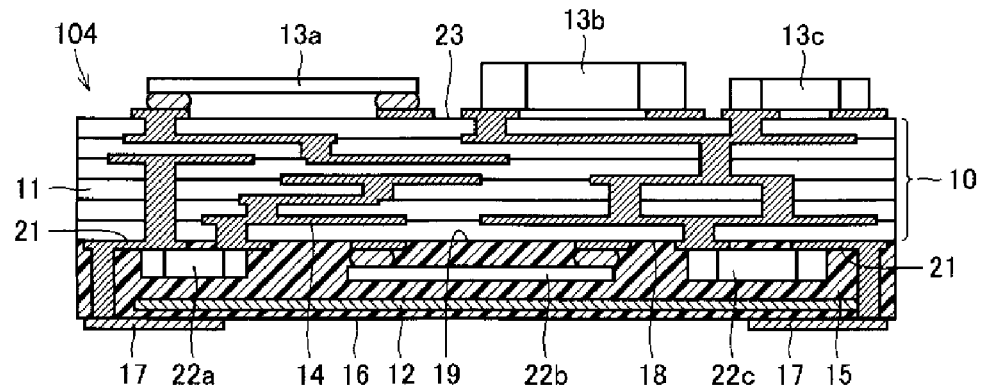
FIG. 4 is a sectional view of a ceramic multilayer substrate according to a fourth preferred embodiment of the present invention.

In particular, as shown in FIG. 4, preferably, the electronic components 22a, 22b, and 22c defining the first circuit components are disposed within the region determined by projecting the ground electrode 12 on the first main surface 18. This is because the ground electrode 12 provides a shielding effect on the first circuit components in this configuration.

Figure 3:
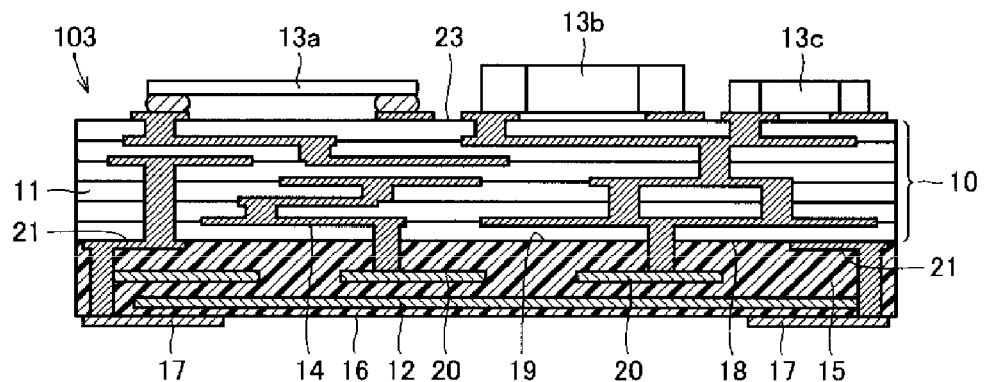
FIG. 3 is a sectional view of a ceramic multilayer substrate according to a third preferred embodiment of the present invention.

As shown in FIG. 3 and FIG. 4, the ceramic multilayer substrates 103 and 104 are provided with relay electrodes 21 arranged so as to extend along the first main surfaces 18. The electrical connection from the external electrode 17 to the internal circuit element 14 is provided via the relay electrode 21. The electrical connection from the external electrode 17 to the internal circuit element 14 may be provided by direct via-to-via connection. However, it is preferable to provide the relay electrode 21, as shown in FIG. 3 and FIG. 4, because the location of an upper via and the location of a lower via can be shifted with respect to each other. Therefore, the flexibility in the design is increased. This is not limited to the ceramic multilayer substrates 103 and 104 in the third and fourth preferred embodiments. The same holds true in the other preferred embodiments.

As shown in each of the above-described preferred embodiments, preferably, the second main surface 23 is disposed on the side opposite to the first main surface 18, and surface-mount electronic components 13a, 13b, and 13c, such as semiconductor devices and chip type monolithic capacitors, are mounted as second circuit components on the second main surface 23. This is because a multifunctional high-frequency module can be constructed using such a configuration.

Fifth Preferred Embodiment

Figure 5:
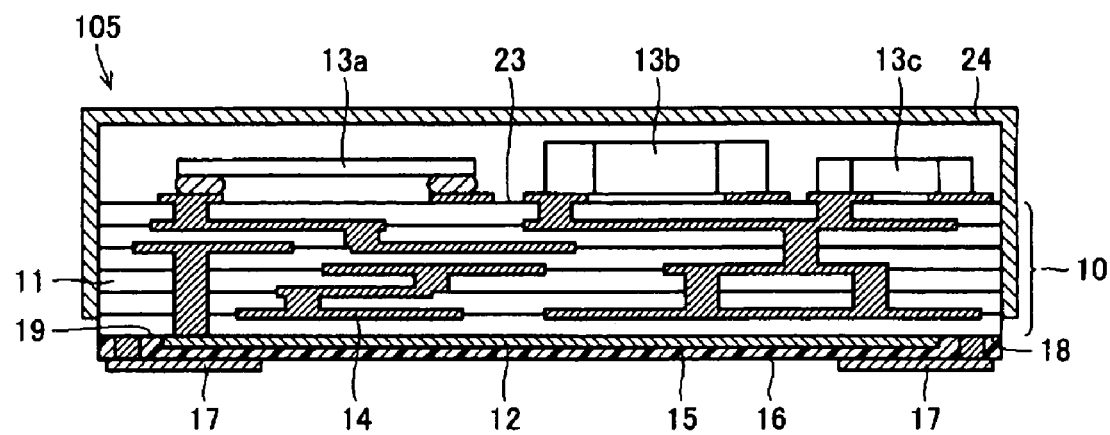
FIG. 5 is a sectional view of a ceramic multilayer substrate according to a fifth preferred embodiment of the present invention.

A ceramic multilayer substrate 105 in the fifth preferred embodiment according to the present invention will be described with reference to FIG. 5. This ceramic multilayer substrate 105 corresponds to the ceramic multilayer substrate 101 in the first preferred embodiment, in which a conductor case 24 is attached so as to cover the electronic components 13a, 13b, and 13c defining the second circuit components mounted on the second main surface 23.

In the present preferred embodiment, since the second circuit components are covered with the conductor case 24, the second circuit components are shielded against external electromagnetic waves, and leakage of electromagnetic waves generated by the second circuit components to the outside is also prevented.

Figure 6:
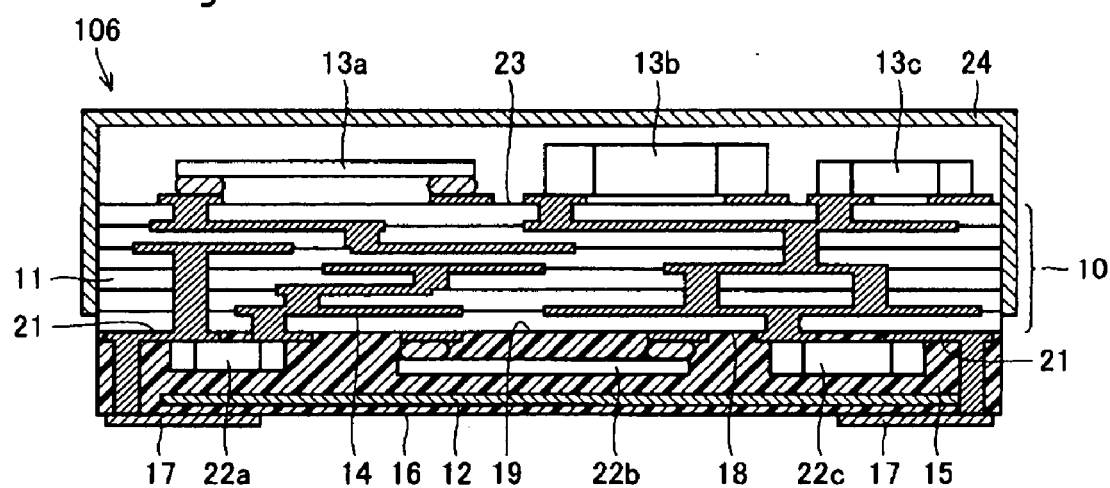
FIG. 6 is a sectional view of another example of the ceramic multilayer substrate in the fifth preferred embodiment of the present invention.

The present preferred embodiment was described with reference to the ceramic multilayer substrate 101 in the first preferred embodiment. However, as shown in FIG. 6, the conductor case 24 may be attached to the ceramic multilayer substrate 106, which is similar to the ceramic multilayer substrate 104 in the fourth preferred embodiment. Alternatively, the conductor case 24 may be attached to the ceramic multilayer substrate in the second preferred embodiment or the third preferred embodiment.

Sixth Preferred Embodiment

Figure 7:
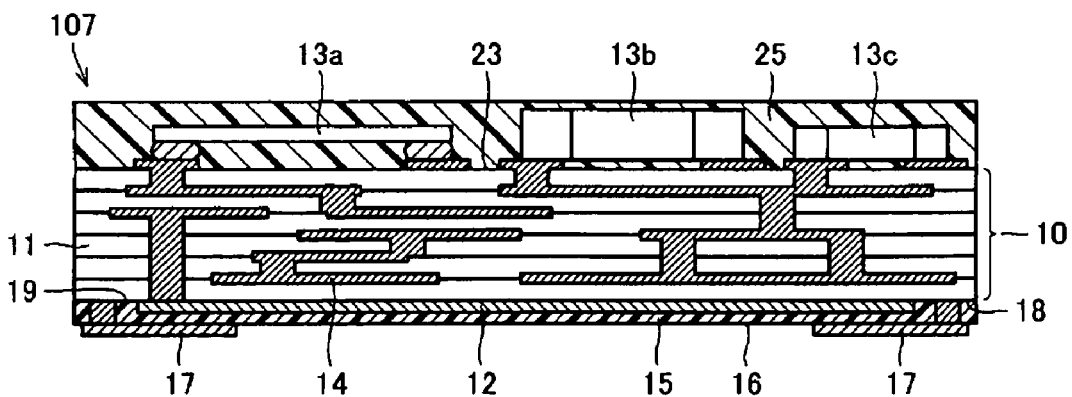
FIG. 7 is a sectional view of a ceramic multilayer substrate according to a sixth preferred embodiment of the present invention.
Figure 8:
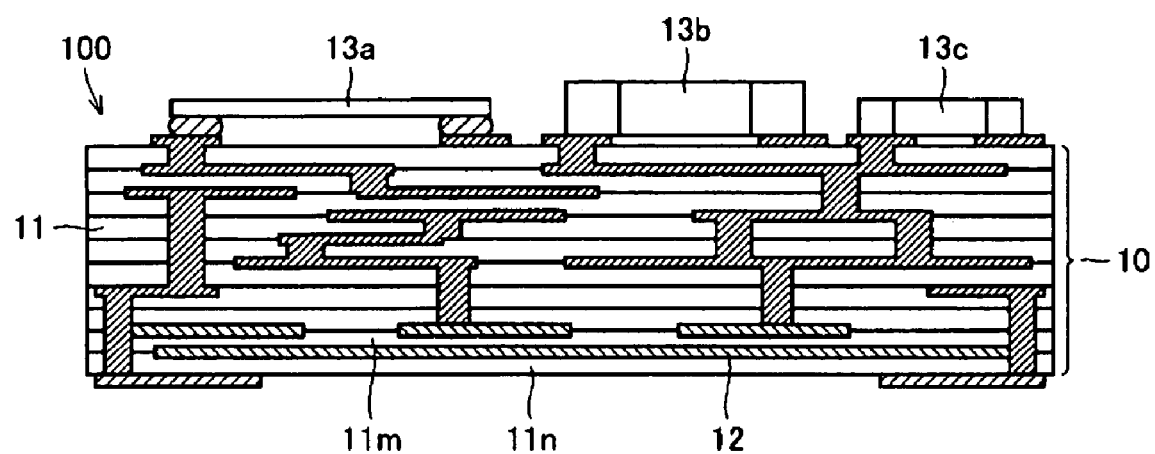
FIG. 8 is a sectional view of a ceramic multilayer substrate according to a known technology.

A ceramic multilayer substrate 107 in the sixth preferred embodiment according to the present invention will be described with reference to FIG. 7. This ceramic multilayer substrate 107 corresponds to the ceramic multilayer substrate 101 in the first preferred embodiment, in which a molded resin layer 25 is provided to cover the electronic components 13a, 13b, and 13c defining the second circuit components mounted on the second main surface 23. Therefore, the detailed configurations of the other portions are similar to those described in the first preferred embodiment.

In the present preferred embodiment, since the second circuit components are covered with the conductor case 24, the second circuit components are protected from, for example, collision with other components. The present preferred embodiment was described with reference to the ceramic multilayer substrate 101 in the first preferred embodiment. However, the conductor case 24 may be attached to any one of the ceramic multilayer substrates according to the second, third, and fourth preferred embodiments.

The present invention can be applied to ceramic multilayer substrates generally used for high-frequency modules mounted in the inside of information communications apparatuses, for example.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the present invention which fall within the true spirit and scope of the invention.

The invention claimed is:

1. A ceramic multilayer substrate comprising:
a ceramic laminate including a plurality of ceramic layers, having a first main surface, and including internal circuit elements disposed inside of the laminate;
a resin layer having a bonding surface in contact with the first main surface of the ceramic laminate and a mounting surface opposite to the bonding surface and arranged to face and be mounted to a mother board;
external electrodes, each disposed on the mounting surface of the resin layer and electrically connected to at least one of the internal circuit elements of the ceramic laminate; and
a ground electrode disposed inside of the resin layer; wherein the ground electrode is arranged to overlap at least one of the external electrodes in a direction of lamination of the plurality of ceramic layers.

2. The ceramic multilayer substrate according to claim 1, wherein the ground electrode includes a sintered metal integrally baked with the ceramic laminate.

3. The ceramic multilayer substrate according to claim 1, further comprising a first circuit component mounted on the first main surface and covered with the resin layer, wherein the ground electrode are disposed on a side that is closer to the mounting surface than the first circuit component.

4. The ceramic multilayer substrate according to claim 3, wherein the first circuit component is disposed within a region defined by projecting the ground electrode on the first main surface.

5. The ceramic multilayer substrate according to claim 1, further comprising relay electrodes disposed so as to extend along the first main surface, wherein electrical connections from the external electrodes to the internal circuit elements are provided through the relay electrodes.

6. The ceramic multilayer substrate according to claim 1, wherein the ceramic laminate comprises a second main surface on an opposite side to the first main surface, and a second circuit component is mounted on the second main surface.

7. The ceramic multilayer substrate according to claim 6, wherein a conductive case is disposed on the second main surface to cover the second circuit component.

8. The ceramic multilayer substrate according to claim 6, wherein the second circuit component on the second main surface is covered with a molded resin layer.

* * * * *